United States Patent [19]
Keating et al.

[11] Patent Number: 5,684,466
[45] Date of Patent: Nov. 4, 1997

[54] ELECTRICAL STRIKE SYSTEM CONTROL FOR SUBSURFACE BORING EQUIPMENT

[75] Inventors: Donald J. Keating; Joel B. Edwards; Bradley E. Mitchell, all of Perry; Kelvin P. Self, Stillwater, all of Okla.

[73] Assignee: The Charles Machine Work, Inc., Perry, Okla.

[21] Appl. No.: 526,970

[22] Filed: Sep. 12, 1995

[51] Int. Cl.$^6$ .................................................. G08B 21/00
[52] U.S. Cl. ........................... 340/662; 340/661; 340/664; 361/7; 361/79
[58] Field of Search .................................. 340/662, 661, 340/664, 650, 651; 361/7, 79

[56] References Cited

U.S. PATENT DOCUMENTS

| | | | |
|---|---|---|---|
| 3,771,049 | 11/1973 | Piccione | 324/51 |
| 4,335,437 | 6/1982 | Wilson et al. | 364/483 |
| 4,396,868 | 8/1983 | Watanabe et al. | 315/130 |
| 4,420,721 | 12/1983 | Dorey et al. | 324/110 |
| 4,755,805 | 7/1988 | Chau | 340/662 |
| 4,837,653 | 6/1989 | Yip | 361/86 |
| 4,881,028 | 11/1989 | Bright | 324/127 |
| 4,937,561 | 6/1990 | Sasaki et al. | 340/646 |
| 4,977,513 | 12/1990 | LePalme | 364/483 |
| 5,027,108 | 6/1991 | Gray | 340/662 |
| 5,034,659 | 7/1991 | Taniguchi | 315/131 |
| 5,051,733 | 9/1991 | Neuhouser | 340/660 |
| 5,065,142 | 11/1991 | Green | 340/660 |
| 5,073,724 | 12/1991 | Fox | 307/360 |
| 5,087,870 | 2/1992 | Salesky et al. | 323/276 |
| 5,103,111 | 4/1992 | Tobin et al. | 307/130 |
| 5,157,285 | 10/1992 | Allen | 307/465 |
| 5,223,795 | 6/1993 | Blades | 324/536 |
| 5,313,106 | 5/1994 | Swanson | 307/130 |
| 5,371,959 | 12/1994 | Ahs | 37/443 |

OTHER PUBLICATIONS

"Electrical Strike System: Your Life May Depend On It", G.A. Stangl, et al., No–Dig 92, Washington, D.C., U.S.A. (Apr. 1992).

Video entitled "Important Information From Ditch Witch", The Underground Authority.

"Original ESS" system: Electric Strike Indicator System Operator Instructions, Electrical Strike Indicator Device (ESID), Technical Bits, Electrical Strike Simulator, and schematics.

*Primary Examiner*—Jeffery Hofsass
*Assistant Examiner*—Daniel J. Wu
*Attorney, Agent, or Firm*—Sidley & Austin

[57] ABSTRACT

An electrical strike sensing system for providing an alarm if the underground boring equipment encounters a potentially hazardous condition. The system senses current carried through the equipment, as well as the voltage between the equipment and a reference. The measured current is converted to a percentage of a reference current, and the voltage is converted to a percentage of a reference voltage. The current and voltage percentages are added, and if the sum exceeds 100%, the alarms are activated. The current and voltage percentages, as well as the date and time of the strike, are stored in a nonvolatile memory.

29 Claims, 4 Drawing Sheets

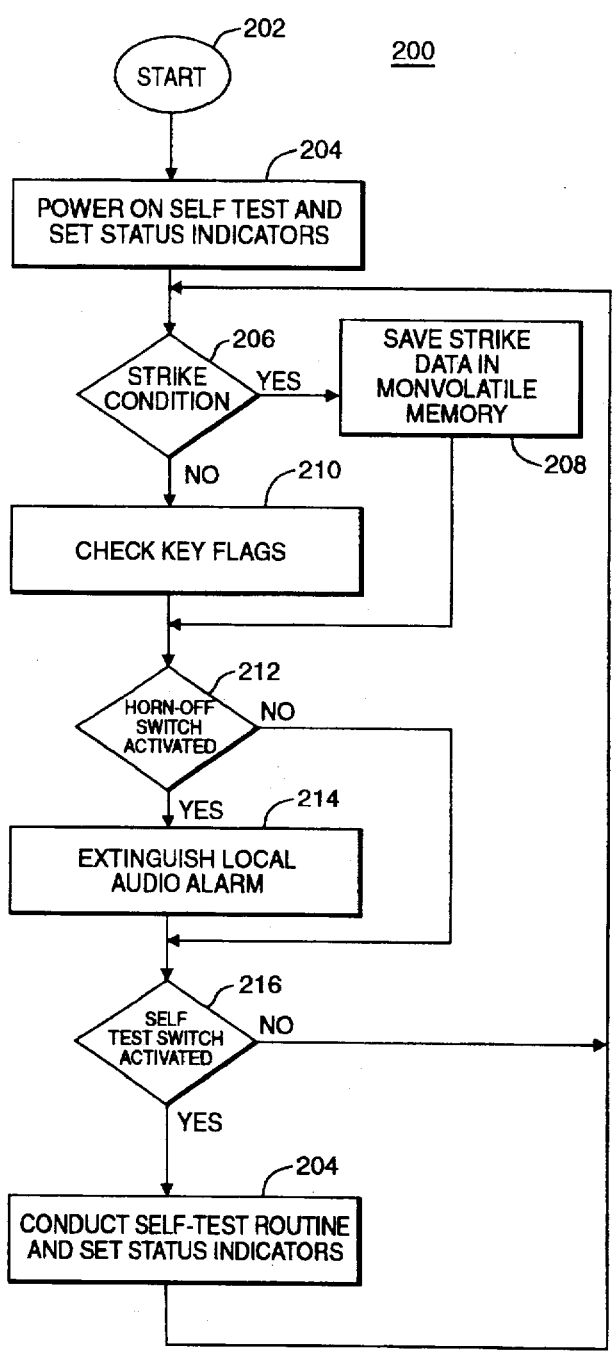
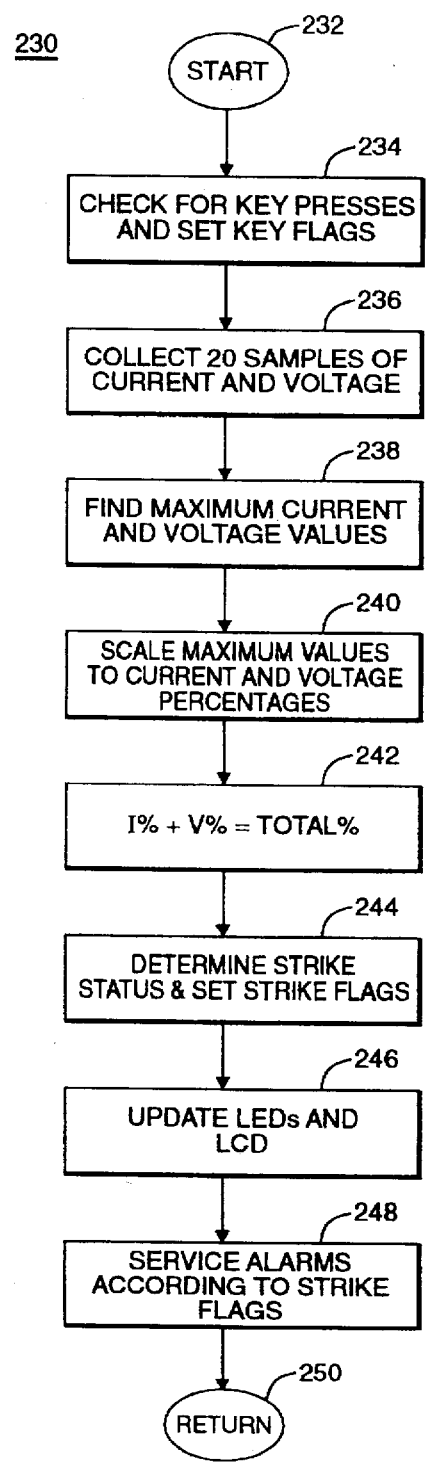

ELECTRICAL STRIKE SYSTEM CONTROL FOR SUBSURFACE BORING EQUIPMENT

TECHNICAL FIELD OF THE INVENTION

The present invention relates in general to electrical circuits for detecting the presence of voltage and/or current, and more particularly to sensing circuits and indicators for accurately determining when electrical power becomes dangerous for personnel operating underground boring equipment.

BACKGROUND OF THE INVENTION

The installation, maintenance and repair of underground utilities often require digging, excavation or boring in locations where the underground utilities exist. Of primary concern is the inadvertent damage to electrical conductors which can cause extensive damage to personnel and property. In order to circumvent the inadvertent damage to utility lines, notices are often placed in the path of the utility lines, and detailed maps and surveys are not always maintained by the utility companies. Further, before any digging or boring begins, metallic conductors or lines can be located with surface locating equipment, thereby identifying the approximate location of the utility lines or conductors. Notwithstanding all of these safety precautions, accidental damage to utility lines continues to occur, despite the many precautions and safety measures that are available.

Of particular interest to workmen are the safety measures that must be taken to protect against the inadvertent contact with a live, underground electrical cable. Despite that the mechanical boring equipment is in electrical contact with the earth, dangerous voltages can nevertheless be carried from the underground cable, through the equipment and to the operator or personnel. Many precautions are available for protecting the workmen from dangerous levels of electricity. Many of the precautions are identified and described in the publication "Electrical Strike System: Your Life May Depend On It", by Keating, et al., *International Society for Trenchless Technology*, Apr. 5–8, 1992.

Of the standard precautions for personnel, there is provided at the boring site metallic ground mats to provide an equipotential grid on which the workers can stand. Further, the frame of the equipment itself, as well as the equipotential grid are sometimes connected by a heavy duty cable to a ground rod which is driven into the ground. Moreover, personnel are required to wear electrically insulating gloves and boots, and numerous instruction, warning signs and decals are fixed to the equipment. Other protective techniques include electrical circuits for sensing when the equipment encounters a live electrical cable.

In practice, it has been found that the use of a grounding rod connected to the equipment, or the "grounding effect" of the boring unit within the ground itself, does not provide acceptable protection to personnel who may be touching or otherwise in contact with the equipment. It is well known that an electrical current as small as 18 milliamp passing through the body of a person may cause difficulty in breathing. A current that exceeds about 50 milliamp through the body can interrupt the breathing, and possibly cause death. If a current of about 100 milliamp passes through the person's body, ventricular fibrillations (i.e., an uncontrolled quivering of the heart where blood is not pumped) can occur. Ventricular fibrillations eventually result in death, unless medical assistance utilizing a defibrillator is quickly utilized so that the heart resumes normal functioning. The resistance of a human body can range from less than one kilohm to more than ten kilohms, depending on conditions. A typical body resistance is normally about one kilohm. From these electrical parameters, voltages above about 30 volts (rms) can cause a sufficient current flow to result in serious bodily injury, and possibly even death. OSHA standards consider that a "shock hazard" exists if a potential of more than 42.4 volts peak (30 volts rms) or a current through a 1500 ohm load is more than five milliamp. From the foregoing, normal residential household voltages of 110 VAC are sufficient to cause serious bodily harm or death. However, underground electrical utility cables may carry voltages up to 35,000 volts and higher. Thus, underground boring activity or excavation in the area of any type of electrical utility cables presents a potential danger to personnel.

It is further noted that most electrical power utility generating and distribution stations include interrupters that momentarily interrupt the power line if an overload exists. The operation of the interrupters is such that when an overload does occur, AC power is momentarily disconnected from the line, but is reconnected shortly thereafter. The interruption can occur three or more times, spaced from each other at varying intervals. Hence, personnel should be warned, and strike voltage sensor and alarm systems should accommodate and be equipped to handle such interruptions.

Strike sensing systems have been developed for providing warnings to operating personnel, should the equipment encounter an underground electrical cable. Such electrical strike sensing systems are well known in the field and obtainable from The Charles Machine Works, Perry, Okla. Such a system has both a current and voltage monitor, and an alarm that is activated if either the current or the voltage exceeds a predefined value. The system can be set and reset, and built-in protective circuits reduce the likelihood of being disabled or destroyed by a high voltage contact with power lines.

Another warning device is disclosed in U.S. Pat. No. 4,755,805, by Chau. In such system, a contact is detected between the drilling device and a source of high voltage, by sensing current flow through a grounding rod and a grounding cable, which includes a transformer. An operational amplifier compares a voltage induced in the transformer with a set point reference, and provides an audio alarm when the induced voltage is greater than the set point reference. The device determines when the current exceeds a predefined value before providing an alarm. Essentially, the current flowing through the ground path of the device is measured, without regard to any voltage present.

U.S. Pat. No. 5,027,108 by Gray, describes a voltage sensing system that monitors the voltage gradients in the earth when such gradients exceed a predetermined value. When a boring machine contacts a buried power line, voltage gradients are generated in the earth and are detected. A pair of stakes inserted into the earth at a spaced apart distance detect such voltage gradients, and compare the same with a reference voltage. When the gradients exceed the reference voltage, an alarm is sounded to warn workmen in the area of a strike of the equipment with the underground electrical line.

One common problem with the electrical strike sensors is the ability to provide warnings to personnel when the electrical voltage and current coupled to equipment from the buried cable is sufficient to cause bodily harm, while yet preventing false alarms due to stray electromagnetic fields or transients triggering the alarm system. A need therefore exists for an improved technique to more reliably determine when equipment has contacted an electrical power cable. A further need exists for determining when either the voltage or current carried by the equipment reaches a level such that potential bodily injury is possible. Another need exists for a reliable technique to assure that electrical sensor alarms are extinguished only after it is determined that the electrical strike has been removed and that the sensing circuits are operating properly. Another need exists for storing history data within the sensor system that represents the magnitude of the current and voltage present at the equipment during the electrical strike, and the time of occurrence of the strike.

SUMMARY OF THE INVENTION

According to the principles and concepts of the invention disclosed herein, an electrical strike sensor reliably provides a threshold which, when compared with a combined voltage and current indication, produces an alarm warning personnel of a possible dangerous electrical condition of the equipment.

According to a preferred embodiment of the invention, a current transformer senses the current carried by the equipment, should such equipment come into contact with a live power line. Voltage produced by the live power line between the equipment and ground is also measured. The current and voltage indication are digitized and processed by a programmed microprocessor. The peak values of current and voltage are determined over an electrical cycle. The current and voltage values are then converted to respective ratios, based upon predefined current and voltage reference levels. For example, the measured voltage is compared to an effective 30-volt rms reference (42.4 volt peak), which level corresponds to a voltage presenting a potential for bodily harm. The measured current indication is compared with an effective 300 milliamp rms current reference level (424 milliamp peak), which current is above that for false alarms. Thereafter, the processor adds the current and voltage percentages together to determine if the sum exceeds 100%. If so, an alarm is generated.

Once an alarm is generated, the alarm condition parameters are stored in a nonvolatile memory. In the preferred form of the invention, the sensed voltage level and the sensed current level is stored, as well as the year, month, day and time of day that the strike occurred. The operator can turn off some of the alarms, but not all of the alarms until a self-test of the sensor circuits is carried out. On the manual operation of a self-test switch, the sensor induces a current in the current transformer and supplies a voltage in a portion of the voltage circuitry, and measures the same to assure that a portion of the sensing circuits are working. If the hazardous condition has been removed and the circuits are working, the alarms are extinguished.

BRIEF DESCRIPTION OF THE DRAWINGS

Further features and advantages will become apparent from the following and more particular description of the preferred embodiment of the invention, as illustrated in the accompanying drawings in which like reference characters generally refer to the same parts or elements throughout the views, and in which:

FIG. 4 is a block diagram illustrating the main executive program of the microcontroller; and FIG. 5 is a block diagram illustrating the interrupt service routine of the microcontroller.

DETAILED DESCRIPTION OF THE INVENTION

Figure 1:
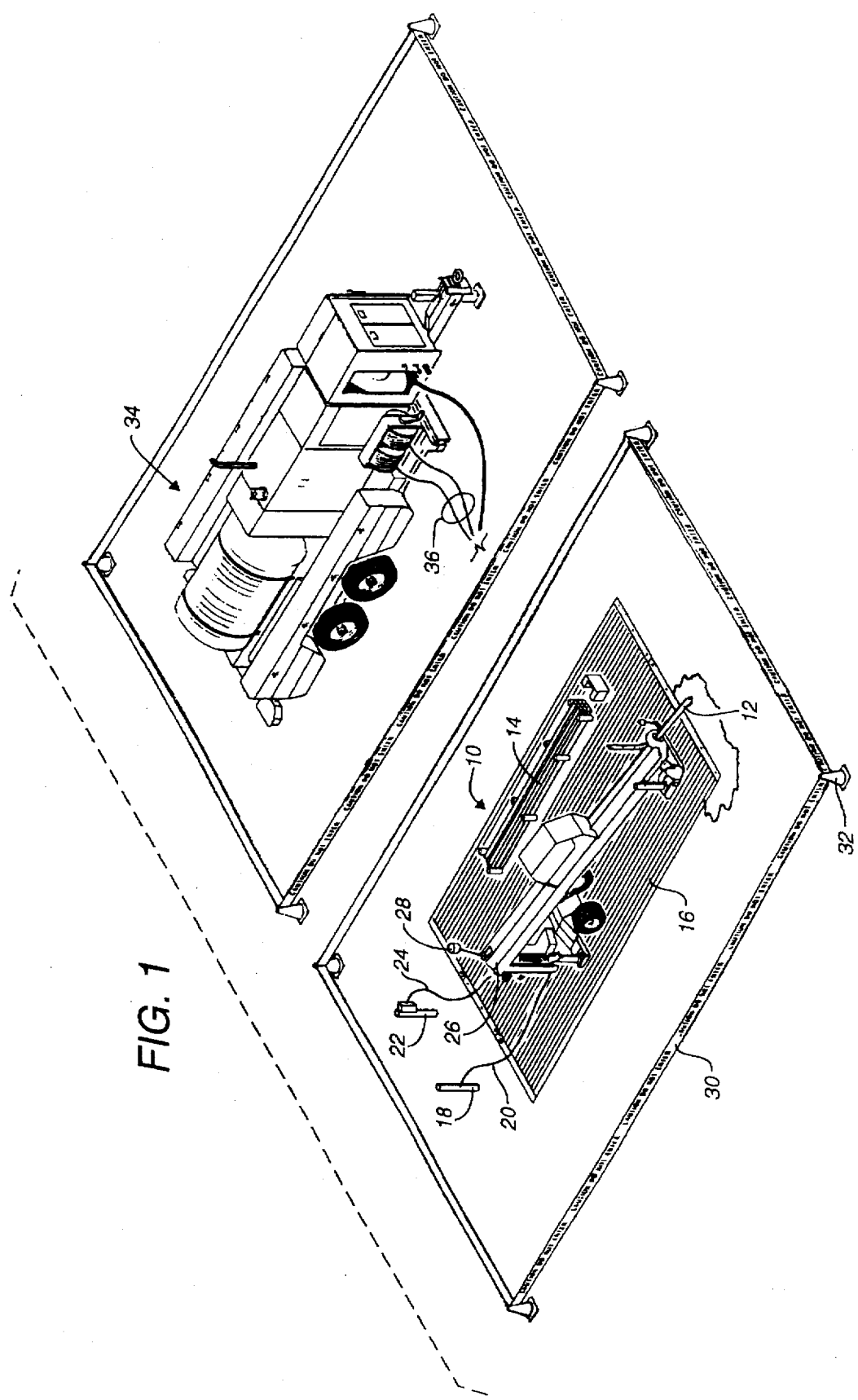
FIG. 1 depicts a conventional underground boring unit in its environment of operation, with some of the various safeguards for protecting personnel from electrical shocks.

FIG. 1 illustrates an example of an environment in which the present invention can be advantageously practiced. Underground boring equipment, such as identified by reference numeral 10, is effective to form a bore in the earth, using drill pipes 12. The underground boring unit 10 can be, for example, of the type identified by Jet Trac® boring units, obtainable from The Charles Machine Works, Perry, Okla. While not shown, the equipment 10 includes directional sensors for guiding the boring head (not shown) attached to the leading drill pipe 12. A supply of pipe extensions 14 to the drill pipe are located adjacent the equipment 10. The directional boring unit 10 is electrically connected between the frame of the directional boring unit 10 and an equipotential grid 16. A ground rod 18 may be staked firmly into the ground, and connected to the frame of the directional boring unit 10 by way of a heavy cable 20. Purposefully spaced away from the ground rod 18 and the underground boring unit 10 is a voltage sensing stake 22 having a voltage limiter circuit (not shown) attached thereto. The voltage limit circuit is connected to the frame of the directional boring unit 10 by way of conductors 24. The electrical strike sensing and alarm circuit 26, constructed according to the invention, provides various audible and visible alarms when potentially hazardous conditions exist with respect to the boring unit 10. One of the visible alarms 28 constitutes a local rotating beacon or strobe light to provide visual indications to operators, workers and the like, that an electrical strike has been encountered. A boundary barrier 30 supported by pylons 32 provides a perimeter around the directional boring unit 10.

Associated with the directional boring unit 10 is a "power pak" 34 for supplying various fluids and electrical voltages to the boring unit 10. One or more bonding cables 36 connect the frame of the supply unit 34 to the directional boring unit 10, thus reducing any voltage difference between the frames of such equipment.

Figure 2:
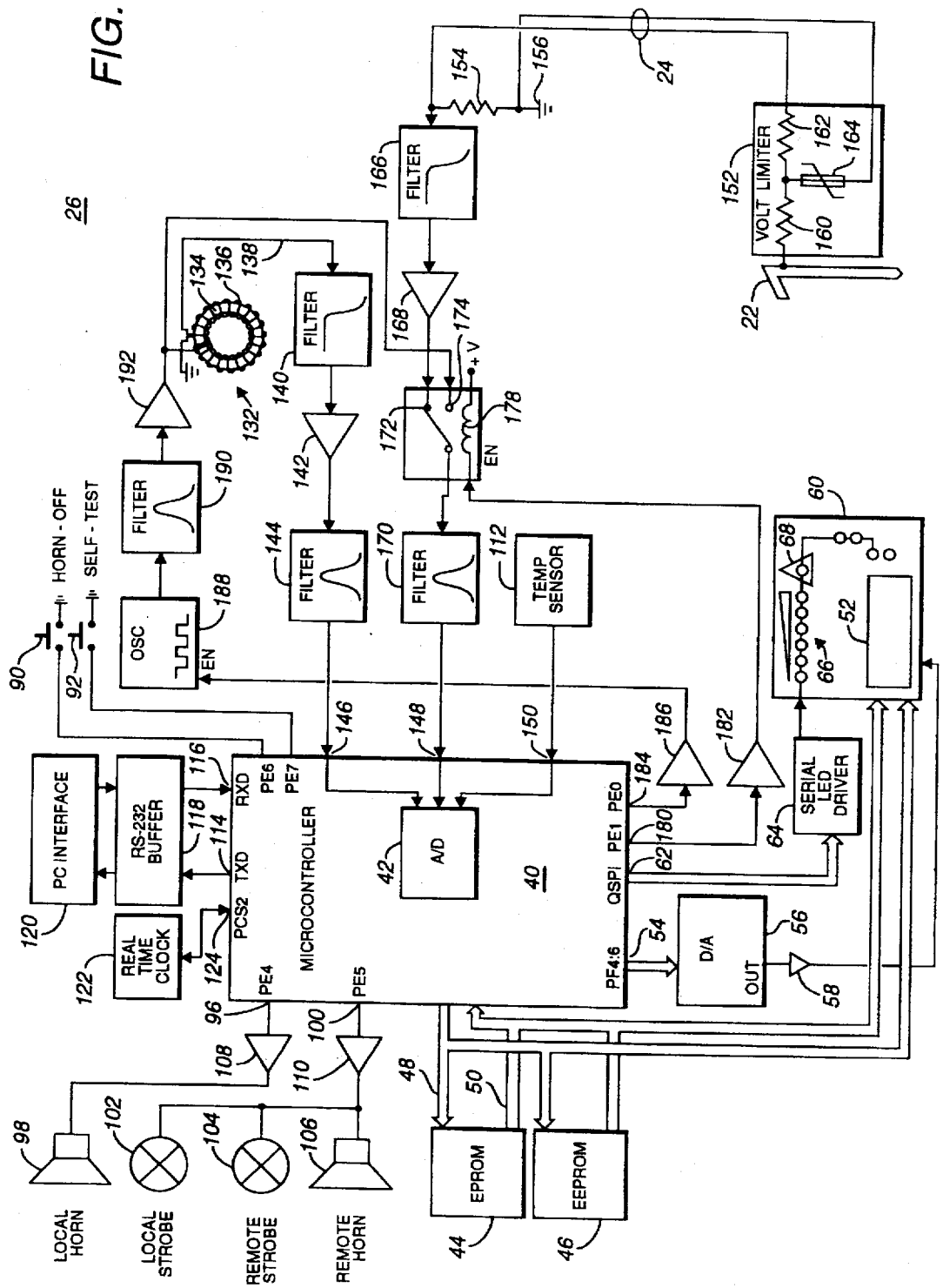
FIG. 2 is a block diagram of the electrical strike sensor and alarm system, constructed according to the preferred embodiment of the invention.

A block diagram of the electrical strike sensor and alarm system 26 is shown in FIG. 2. The strike sensor 26 is processor-controlled, utilizing a programmed microcontroller 40. The microcontroller 40 is of the type 68HC16, obtainable from Motorola. The microcontroller of such type includes an on-chip analog-to-digital (A/D) converter 42, although such converter can be employed as a separate integrated circuit as compared to the microprocessor or microcontroller. A sufficient amount of memory 44 is provided, such as 32K×16 of nonvolatile memory, such as EPROM. Additionally, 8K×16 of nonvolatile memory, such as EEPROM 46, is also provided external to the microcontroller 40. A 16-bit address bus 48 and a 16-bit data bus 50 couple the microcontroller 40 to the related circuits. The address bus 48 and the data bus 50 are coupled to a liquid crystal display (LCD) 52 in the instrument panel 60 for displaying voltage and current parameters, to be discussed more fully below. A general I/O port 54 of the microcontroller 40 drives a digital-to-analog (D/A) converter 56 to provide contrast control to the liquid crystal display 52 by way of a buffer amplifier 58. The microcontroller 40 also drives the display and instrument panel 60 by way of a serial port 62 and a serial light emitting diode (LED) driver 64.

The LED driver 64 drives a number of light emitting diodes 66 in real time to indicate the magnitude of the voltage and current being sensed. The LED 68 located in the triangle signifies a potentially hazardous condition, meaning that the additive sum of any measured current percentage and voltage percentage equals or exceeds 100%. In practice, when an LED in the display 66 is illuminated, all other LEDs to the left thereof are also illuminated. Thus, the LED display 66 operates in the manner of a horizontal bar graph, signifying the relative strength of a voltage and/or current coupled to the equipment 10.

Figure 3:
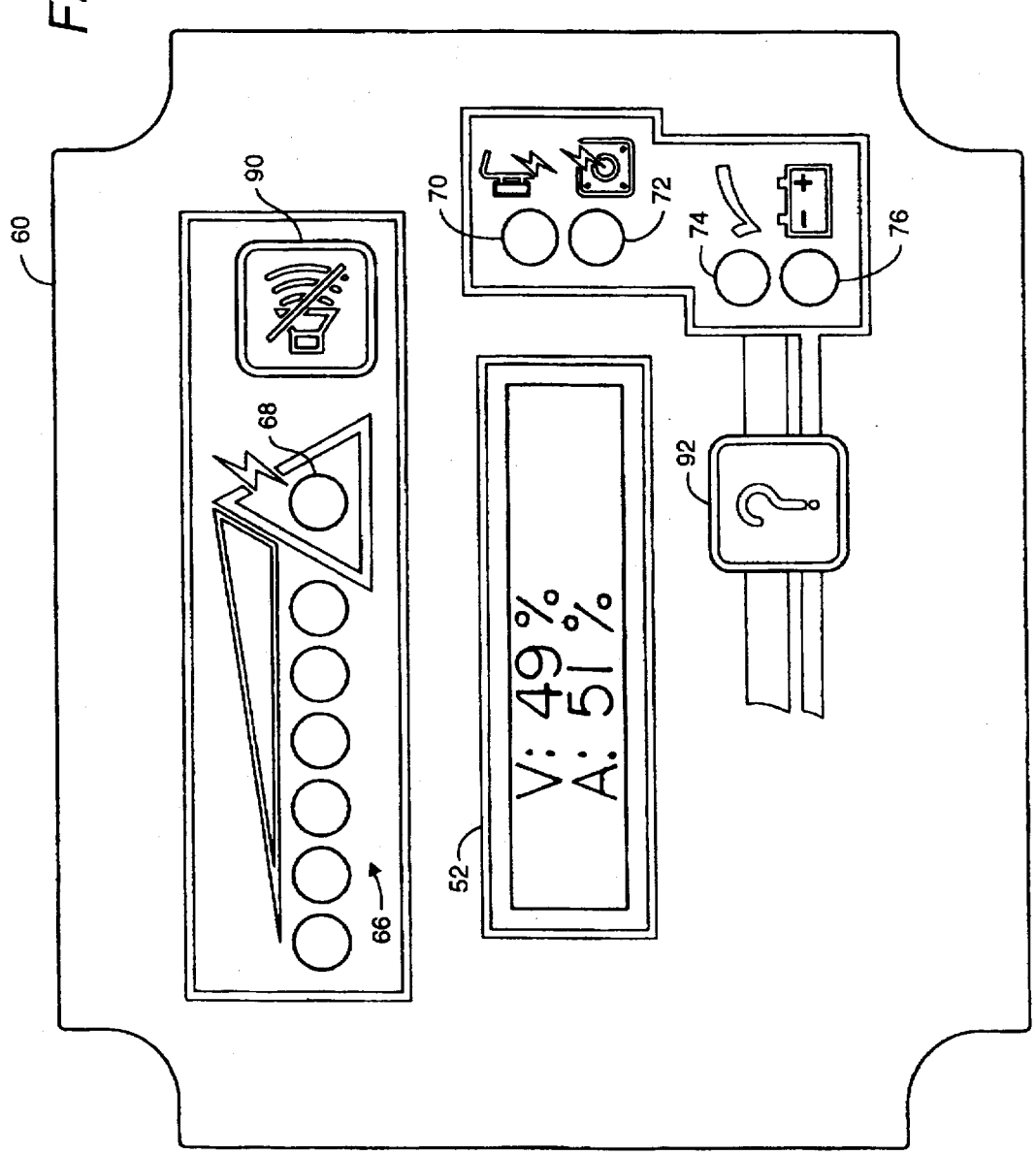
FIG. 3 is a frontal view of the instrument panel of the sensor and alarm system according to the invention, showing the various indicators, readout displays and switches.

The details of the instrument panel 60 are shown in more detail in FIG. 3. An LED indicator 70, when illuminated, indicates a failure of the voltage processing circuits of the sensor system 26. A similar indicator 72, when illuminated, indicates a failure of the current sensing circuits of the sensor system 26. Other visual indications may be provided, such as an LED 74 indicating that the system is operational, and another indicator 76 showing a low voltage of the supply battery. A battery or power supply (not shown) provides an output voltage that is filtered and regulated to provide the requisite supply voltages for driving the electrical strike sensor 26.

The instrument panel 60 includes two switches of the push type. A horn shut-off switch 90 can be manually activated by an operator to remove the audio alarm produced locally to the boring unit 10 in response to an electrical strike. It should be noted that the removal of the local audio alarm does not reset the system, but rather the local visible alarms and the remote alarms remain activated, even if the electrical strike has been removed or interrupted.

The instrument panel 60 is provided with a manual switch 92 for initiating a self-test of the circuits of the electrical strike sensor 26. As will be described more fully below, the alarms can be fully reset after the potentially hazardous condition no longer exists and when the correct operation of the electrical strike sensor 26 is confirmed. It can be appreciated that in view of the possibility of high amplitude voltages being coupled to the directional boring unit 10, there exists the possibility that various circuits of the sensor 26 can be catastrophically damaged as a result thereof. Thus, if the alarms have been extinguished, and system check LED 74 is illuminated, this is an indication that the potentially hazardous conditions no longer exist. However, if LED 74 is off or LED 70 or 72 are on, this is an indication that some portion of the circuit has been rendered inoperative or destroyed. At this time, the LCD 52 may display one or more diagnostic trouble codes. Under these conditions potentially hazardous conditions could continue to exist even though the alarms have been extinguished. Diagnostic trouble codes displayed on LCD 52 have key alpha characters to help identify the part of the sensor 26 which has a problem. For instance "EA1" indicates a problem in the analog to digital converter 42, "EC1" indicates a problem in the current sensing circuit, "EV1" indicates a problem in the voltage sensing circuit, "ES1" indicates a problem in the serial peripheral interface, and "ET1" indicates a problem in the real time clock circuit 122. Additional numeric characters help with more detailed identification of a problem. For instance, "EC2" indicates a problem with the current transformer 132, its connections, or wires connecting it to the main circuit 26.

As noted from the block diagram of FIG. 2, an output port 96 of the microcontroller 40 drives a local audible horn 98. Another port 100 of the microcontroller 40 drives in parallel a local strobe 102, a remote strobe 104 and a remote audible horn 106. Drivers 108 and 110 are employed to provide the requisite energy to drive the visual and audible alarms. The local horn and strobe 98 and 102 are attached to the directional boring unit 10, while the remote strobe and horn 104 and 106 are attached to the power pak unit 34.

A temperature sensor 112 senses the ambient temperature in the environment of the electrical strike sensor 26 and provides corresponding analog signals on a channel to the A/D converter 42. The signal from the temperature sensor 112 is processed to control the contrast of the LCD readout 52. The microcontroller 40 is equipped with a RS-232 transmit port 114 and a receive port 116, each of which is connected to a buffer 118. A personal computer interface 120 is connected to the RS-232 buffer 118 by way of serial receive and transmit lines. With this arrangement, a personal computer (not shown) can be employed to download electrical strike data stored in the EEPROM memory 46, as well as transmit program software to the microcontroller 40.

In accordance with another important feature of the invention, a real time clock 122 is coupled to a general purpose I/O port 124 of the microcontroller 40. The real time clock 122 provides indications of year, month, day, hour, minute and second. Real time clocks are conventionally available with capabilities of providing 136 years of time parameters in increments of seconds. A five-byte binary counter is employed in the real time clock 122. The time parameters are coupled to the microcontroller 40 by way of the port 124.

The current and voltage sensing circuits, as well as the electrical self-test circuits are shown in the block diagram of FIG. 2. A toroid-shaped current sensor or current transformer 132 includes an iron core 134 with about 4,000 turns of wire 136 wound therearound to sense currents induced into the winding 136. The current sensor 132 is fixed to the directional boring unit 10 at a location where the drill pipe 12 is forced therefrom and into the ground. The drill pipe 12 passes through the central portion of the current sensor 132, and thus if the drill pipe 12 strikes an underground power cable, current flowing through the drill pipe 12 to the directional boring unit 10 induces a current into the winding 136, thereby providing an indication of the magnitude of the current carried by the drill pipe 12. The turns ratio of the current sensor 132 or pick-up coil is about 4,000:1, whereby for 4,000 amps of current passing through the drill pipe 12 there is induced a current of about one amp in the current sensing winding 136. The size of the wire forming the winding 136 is a function of the amount of current expected to be carried thereby, and thus is a result of the type and nature of underground cable that might be contacted. Underground power cables carry voltages ranging anywhere from 110 volts upwardly to 35,000 volts, with currents up to 500 amps or higher, are utilized in present day power distribution systems. In the preferred form of the invention, the coil windings 136 are formed with 23 gauge wire wound about the core 134 with about 4,000 turns. It is sufficient to understand that a current carried by the drill string 12 which extends through the current sensor 132 induces a corresponding current in the winding 136. The current induced in the winding 136 is carried by a conductor 138 to a conventional "T" type low pass filter 140. While not shown, the input of the filter includes a shunt resistor for producing a voltage corresponding to the induced current. The low pass filter 140 removes RF components. In this manner, power line frequencies, such as 60 hertz in the U.S. and 50 hertz in Europe, are substantially unattenuated by the filter 140. An amplifier 142 having a gain of about five amplifies the filtered voltages. The input of the amplifier 142 includes a diode arrangement which clamps the amplifier input voltages to ±0.7 volts. In practice, the amplifier 142 and the low pass filter 140 comprise an active filter well known in the art.

The output of the amplifier 142 drives a bandpass filter 144 tuned to about 55 hertz, thereby allowing a passband between 50–60 hertz which is typical of power line frequencies. Frequencies beyond this range are substantially attenuated, whereby the current sensing circuit is sensitive primarily to power line frequencies. The output of the bandpass filter 144 is coupled to one input 146 of the microcontroller 40 and is coupled internally to one channel of the A/D converter 42. The A/D converter 42 converts the analog input signals to corresponding digital signals for further processing according to a routine to be described below. The microcontroller 40 thereby receives information concerning the magnitude of current coupled from the underground conductor through the string of drill pipes 12.

As noted above, the microcontroller 40 also processes voltage information to which personnel can be subjected, if they are in contact with the frame of the boring equipment 10. As noted above in connection with FIG. 1, the strike sensing voltage stake 22 is purposefully spaced apart from the ground rod 18 and any other part of the boring unit 10 by at least two meters. The function of the ground rod 18 and the heavy duty cable 20 is to carry the majority of strike current flowing through the directional boring unit 10, and divert the same to earth ground. In other boring units, anchor stakes, stabilizer feet and any other metallic portions of the frame or unit contacting the ground may provide the grounding function. In contrast, the purpose of the strike sensing voltage stake 22 and the voltage limiter 152 is to sense the voltage present on the frame of the directional boring unit 10 with respect to the ground, and provide an indication thereof to the microcontroller 40.

With reference again to FIG. 2, the voltage limiter 152 is electrically clipped or otherwise fixed directly to the metallic strike sensing voltage stake 22. The voltage limiter 152 is connected by conductors 24 to the sensing unit attached to the frame of the directional boring unit 10. A 20.5K resistor 154 is connected between the conductors 24 and circuit ground 156 of the sensing circuit 26. The voltage limiter 152 includes a high voltage series resistor 160 connected in series with a conventional resistor 162, the series combination being connected to the active conductor of the pair 24. In the preferred form of the invention, the high voltage resistor 160 is 360K and the standard resistor 162 is 330K in value. At the junction of resistors 160 and 162, there is connected a metal oxide varistor 164 which limits the voltage at such junction to about 400 volts. The end of the varistor 164 is connected to circuit ground 156. With this arrangement, the voltage of the frame of the directional boring unit 10 can be determined with respect to earth ground at the voltage stake 22. This is generally the voltage difference to which equipment operators may be subjected during a strike with an underground power cable, in the absence of the use of an equipotential grid 16. The equipment frame of the boring unit 10 and the circuit ground are tied together and considered to be the same voltage.

The voltage between the conductor pair 24 is developed across resistor 154, which provides an input voltage to a low pass filter 166. Again, the low pass filter 166 is a "T" type filter for removing high frequency components and for freely passing low frequency signals, such as 50–60 hertz. An amplifier 168 which is integrated with the filter 166 provides a sufficient gain and isolation of the signal, with respect to a bandpass filter 170. The output of the amplifier 168 is switched through a normally closed relay contact 172 to the bandpass filter 170. The relay can be switched to contact 174 by way of energization of the coil 178, for test purposes. When in a non-test mode, the output signal of the amplifier 168 is passed through the bandpass filter 170 to pass 50–60 hertz and attenuate frequencies outside such band. The output of the filter 170 is coupled by way of an input channel 148 to the A/D converter 42. The voltage sensed by the circuit 26 is thus made available to the microcontroller 40 for processing according to an algorithm to be described in detail below.

As an integral part of the warning to personnel, the sensing circuit 26 includes a self-test actuator, comprising the switch 92 (FIG. 3) that is operable by personnel. When the self-test switch 92 is activated, the program-controlled microcontroller 40 senses the same and provides a steady state signal on I/O port 180 which, when driven through a buffer amplifier 182, allows current to flow through the relay coil 178, and switch the bandpass filter 170 to switch pole 174. As a result of the relay being energized, the output of amplifier 168 is disconnected from the bandpass filter 170. Additionally, the I/O port 184 is activated, and through buffer driver 186, an oscillator 188 is enabled. The oscillator 188 is a 60 cycle square wave, with an amplitude of about five volts. A conventional filter 190 converts the square wave signal into a sine wave which is applied to an amplifier 192. The output of the amplifier is connected to a conductor that is wound with about six turns around the toroid core 134 of the current sensor 132. Moreover, the sine wave output of the amplifier 192 is coupled through the switch contact 174, is filtered by the bandpass filter 170, and is applied to one input channel of the A/D converter 42. The current induced by the amplifier output 192 into the current transformer 132 is inductively coupled to the winding 136 and by way of conductor 138 to the low pass filter 140. The processing of the current signal proceeds in the manner described above in connection with an actual electrical strike, and is coupled as a voltage to an input channel of the A/D converter 42.

Accordingly, the self-test circuit, when actuated, provides a pseudo strike voltage and current to assure that the respective circuits are operating properly and have not been destroyed by an actual electrical strike. Those skilled in the art may prefer to utilize an additional set of relay contacts to make the test circuit independent of the current transformer 132. However, the present circuit tests the windings 136 of the current transformer 132 to assure that the coil wire is intact and not open circuited.

With reference now to FIGS. 4 and 5, there is illustrated the primary programmed operations of the microcontroller 40. The microcontroller 40 is programmed to carry out a number of operations to process the sensed current via the current sensing transformer 132 and the sensed voltage via the voltage limiter 152. The sensed current and voltage signals are processed to provide reliable alarms and warnings to personnel, without false triggering due to spurious signals and the like. It can be readily appreciated that when sensor circuits are prone to false triggering, the personnel operating the equipment are less likely to take heed to the warnings, as bona fide warnings cannot be distinguished from false warnings.

FIG. 4 illustrates the various functions carried out by the microcontroller 40 in accordance with a main executive program 200. Program flow block 202 represents the start of the executive program loop. In block 204, the microcontroller 40 senses a power-up of the sensing and alarm circuit 26 and automatically carries out a self-test of the various circuits, including the voltage processing circuits and the current sensing circuits. In the event that any errors or malfunctions are determined, the appropriate status flags are set and the liquid crystal display 52 indicates the error code and the LED indicators are illuminated. If, on the other hand, the automatic self-test shows that all circuits are operational, no error codes are displayed and the LED 74 is illuminated, showing that the system is functional. Processing proceeds to decision block 206, where it is determined if a strike condition exists. If a strike is determined to exist, processing branches to program flow block 208 where the strike data is saved in the nonvolatile memory 46. At this time the real time clock 122 is read to determine the date and time of the strike event. The microcontroller saves in nonvolatile memory 46 the strike data, such as the date, time, electrical current percentage and electrical voltage percentage as determined in the interrupt service routine. In the preferred form of the invention, the strike event history is saved, up to forty events. When strikes in excess of 40 are detected, the oldest event data is overwritten. From either decision block 206 or program flow block 208, processing branches to block 210 where the microcontroller 40 determines whether any pushbutton or key flags of the instrument panel 60 have been set. It is noted that the manual actuation of any of the switches on the instrument panel 60 (FIG. 3) are effective to set a key flag to notify the microcontroller 40 that action is required.

From program flow block 210, processing continues to decision block 212, where the microcontroller 40 determines if the horn-off switch 90 has been depressed by the operator. If such switch has been activated, processing continues to block 214 where the local audio alarm or horn 98 is extinguished. If the horn-off switch 90 has not been activated, processing branches around block 214. In decision block 216, the microcontroller 40 determines if the self-test switch has been activated. If the self-test switch 92 has been activated by the operator, then the self-test routine is conducted, as noted in program flow block 218. In the self-test routine, the oscillator 188 is enabled and the relay coil 178 is energized to connect the test sine wave voltage to the A/D converter 42. As noted above, the oscillator 188 drives the current sensing transformer 132 to provide a signal to the current processing circuits to determine operability thereof. The A/D converter 42 processes both the test current and the test voltage to assure operability of the respective circuits. The A/D converter 42 converts the analog test current and voltage signals to respective digital signals, determines the maximum and minimum amplitudes, and compares the maximum and minimum amplitudes with predefined test values to determine if the test signals are within an acceptable range. After completion of the self-test routine, appropriate LEDs 70, 72 or 74 and illuminated, and any error code associated with diagnostic troubles are displayed on the LCD 52. Additionally, any alarm flags are set or reset, depending on the results of the tests. The alarm flags are reset if the results of the self-test routine show that all circuits are functional and no electrical strike has been detected. Processing branches from program flow block 218, or as a result of a negative determination of the actuation of the self-test switch from decision block 216, back to decision block 206 where processing continues in the main executive loop.

In FIG. 5 there is shown the interrupt service routine 230 carried out periodically by the microcontroller 40. The interrupt timer of microcontroller 40 is programmed to respond to an interrupt about every 62.5 milliseconds. When interrupted, the microcontroller 40 performs the operations shown in FIG. 5. It is noted that the microcontroller 40 can be interrupted irrespective of where in the main executive program 200 processing is currently taking place. The interrupt processing starts at block 232 and proceeds to program flow block 234 to determine if any switches or keys on the instrument panel 60 have been actuated. If so, corresponding key flags are set.

According to program flow block 236, the microcontroller 40 enables the input 146 to capture twenty analog samples of the current sensed by the current sensing transformer 132. Also, the A/D converter 42 is enabled to convert twenty samples of the sensed voltage on input channel 148. In practice, over a period of between 17 milliseconds and 20 milliseconds, current and voltage samples are captured by the A/D converter 42. A current and voltage sample is essentially captured simultaneously on input channels 146 and 148. A small delay is allowed to elapse and a subsequent sample is taken until all twenty samples of current and voltage have been collected. It can be appreciated that by taking 20 samples in 17–20 milliseconds, one cycle is captured.

As noted above, the interrupt timer of the microcontroller 40 is programmed to provide interrupts every 62.5 milliseconds. With this timing, it is assured that at least one of the AC cycles will be captured before the power line circuit breaker trips, which may be about 5–7 AC cycles after an overload.

In program flow block 238, the digitized samples of the current and voltage collected by the microcontroller 40 are processed to determine a maximum value of each analog waveform. Essentially, the microcontroller 40 sequentially compares each digitized current sample with a previous current sample to ascertain the maximum amplitude sample. The same procedure is carried out with the voltage samples to determine a maximum amplitude voltage of the waveform sampled. The maximum voltage and current values are therefore found according to program flow block 238.

Next, the peak current and voltage values are scaled according to program flow block 240. Here, the current value is compared to a 424 milliamp reference to scale the measured current to a percentage. While the 424 milliamp reference current value is arbitrary, it is selected as a reference value because it is generally above a false alarm or spurious signal value. A scaled 50% value would, for example, result if the measured current were 212 milliamp compared to the 424 milliamp reference. In like manner, the measured voltage is scaled according to a 42.4 volt reference to produce a corresponding percentage. If, for example, the measured voltage were 21.2 volts, a resulting 50% scaled value would result when compared to the 42.4 volt reference. As a result of the processing according to program flow block 240, the maximum values of current and voltage are scaled to corresponding percentages, in view of the 424 milliamp and 42.4 volt references. While the 424 milliamp reference and the 424 volt reference are utilized in the preferred embodiment of the invention, a current reference in the range of 350–500 milliamp (peak) and a voltage reference in the range of 35–50 volts (peak) are acceptable.

In program flow block 242, the scaled current and voltage percentages are added together. This is a simple arithmetic addition, whereby the percentage current value is added directly to the percentage voltage value.

The software instructions of program flow block 244 control the microcontroller 40 to determine the status of a strike and set or reset the strike status flag. The set status of the strike flag indicates that a strike either has been detected or is still in progress. As noted above in block 242, when the added result of the current percentage and the voltage percentage either equal or exceed the 100% threshold, a potentially hazardous condition is considered to exist.

In program flow block 246, a number of light emitting diodes in the string 66 are illuminated, based on the combined measured current and voltage percentages. The LEDs are turned on in a manner proportional to the sum of the current and voltage percentages. In the preferred embodiment, there are six light emitting diodes 66 in a string, with a single light emitting diode 68 enclosed within a triangle. The light emitting diode 68, when illuminated, signifies that an electrical strike has been detected, i.e., the combined current and voltage percentages equal or exceed 100%. If the combined current and voltage percentages total 50%, then only the left hand three LEDs of string 66 are illuminated. It is noted that the illumination of the LEDs occur in proportion to the sum of the measured current and voltage, irrespective of whether a potentially hazardous condition has occurred. According to program flow block 246, the LCD readout 52 is also driven to provide a percentage voltage readout and a percentage current readout, as shown in FIG. 3, unless an error code has been displayed according to block 218 in the main executive program of FIG. 4. The display of an error code thereby takes precedence over the display of the current and voltage percentages.

Processing proceeds to program flow block 248, after a determination has been made as to whether the measured current and voltage values constitute a potentially hazardous condition sufficient to produce visual and audio alarms. According to an important feature of the invention, if the added current percentage and voltage percentage equal or exceed 100%, then it is considered that the underground boring equipment 10 has encountered a potentially hazardous condition. If the additive result is less than 100% and the strike flag is reset, no visual or audible alarms are activated. If, on the other hand, the added current percentage and voltage percentage equals or exceeds 100%, a hazardous condition is detected and the local horn 98 and local strobe 102 are activated, as well as the remote strobe 104 and remote horn 106. As noted above, the local alarms are located adjacent the directional boring unit 10, while the remote alarms are located adjacent the auxiliary power equipment 34.

The interrupt service routine 230 is completed in block 250, where processing returns to the point in the main executive program 200 where the interrupt occurred.

Those skilled in the art may choose to provide variations in the signal processing technique as described above. For example, after an initial current percentage and voltage percentage have been determined to exceed 100%, as shown in program flow block 214, the percentage threshold may be increased or otherwise varied from 100% by various steps in subsequent passes through the routine. In like manner, certain advantages may also be realized by varying either the reference 424 milliamp and/or the reference 42.4 volt during subsequent passes through the routine, or on the occurrence of subsequent encounters with a live underground power line. Also, rather than utilizing a simple addition to combine the current percentage and voltage percentage shown in program flow block 210, those skilled in the art may prefer to carry out the combining of these parameters by other mathematical techniques, such as nonlinear addition or multiplication according to predefined equations, graphical determinations, a look-up table, or different weighting between the measured current and voltage. Many other techniques for combining the measured current and voltage parameters may be utilized.

The nonvolatile storage of the strike event history is highly useful in ascertaining the state of events at the time when the drill string 12 encounters a potentially dangerous condition, such as contact with an underground power line. Such data can also be utilized, in certain instances, in assessing liability of either the contractor or the power company, the local municipality, etc. The personal computer (PC) interface 120 shown in FIG. 2 coupled to the RS-232 transmit and receive ports of the microcontroller 40 can also be utilized to retrieve the strike event history from the nonvolatile memory 46. Either a locally situated PC can be employed to retrieve such data, or the data can be read from the nonvolatile memory 46 and transmitted to a remote location by use of a modem. Further, the microcontroller 40 is programmed to respond to the activation of a predefined sequence of the horn-off switch 90 and the self-test switch 92 to display on the LCD readout 52 the most recent strike data. By continued activation of the switches, the strike event data can be retrieved from the nonvolatile memory 46 and displayed on the liquid crystal display 52.

From the foregoing, an electrical strike sensor and alarm system have been disclosed, which system is a substantial advancement over the prior art in terms of reducing false alarms and improving reliability. To that end, various readouts continually present visual indications of the strength of current and voltage sensed relative to predefined references, and in the event a dangerous condition is determined to exceed a predefined threshold, both audio and visual alarms are activated. Once activated, the alarms cannot be extinguished unless a self-test procedure is invoked by the operator, then the audio and visual alarms are deactivated, but only after the sensor system detects that a potentially hazardous condition no longer exists. Another advantage of the sensor according to the invention is that either the sensing of current alone, or voltage alone, or a combination of both can provide an indication of an electrical strike, should the predefined threshold be exceeded. Thus, even if one portion of the sensing circuit, such as the current sensing branch, is inoperative, the voltage sensing branch can still provide an alarm if the threshold is exceeded by the voltage parameter itself. The converse is also true with respect to the current sensing circuit.

While the preferred embodiment of the invention has been disclosed with reference to a particular sensor and alarm system and the method of operation thereof, it is to be understood that many changes in detail may be made as a matter of engineering choices without departing from the spirit and scope of the invention, as defined by the appended claims.

What is claimed is:

1. An electrical strike sensing system for sensing potentially hazardous conditions to personnel when equipment contacts an electrical power conductor, comprising:

a current sensing circuit for sensing current carried by the equipment resulting from said potentially hazardous condition;

a voltage sensing circuit for sensing a voltage between the equipment and a reference;

a processor for converting the sensed current to a current percentage of a predefined reference current, and for converting the sensed voltage to a voltage percentage of a predefined reference voltage;

a predefined threshold value above which dangerous electrical conditions of the equipment are considered to exist;

a combiner for combining said current percentage and said voltage percentage and providing an output; and a comparator for comparing the output of the combining circuit with the threshold value to provide an alarm condition if the combiner output exceeds the threshold value.

2. The electrical strike sensing system of claim 1, wherein the combiner includes an electrical circuit for adding the voltage percentage and the current percentage.

3. The electrical strike sensing system of claim 1, further including a visual readout for displaying the current percentage and the voltage percentage.

4. The electrical strike sensing system of claim 1, further including a string of visual indicators that can be illuminated by the processor to indicate the combined current and voltage percentage.

5. The electrical strike sensing system of claim 1, further including a visual indicator that is illuminated only when the combined current percentage and voltage percentage equals or exceeds 100%.

6. The electrical strike sensing system of claim 1, wherein the predefined reference voltage is in the range of about 42.4 volts±5 volts, and said predefined reference current is in the range of about 424 milliamp±50 milliamp.

7. The electrical strike sensing system of claim 1, wherein said processor is programmed to test said current sensing circuit and said voltage sensing circuit and display an error code on a visual display if a defective sensing circuit is found.

8. The electrical strike sensing system of claim 7, wherein said processor is programmed to display one error code if the current sensing circuit is defective and a different error code if the voltage sensing circuit is defective.

9. The electrical strike sensing system of claim 1, wherein the combiner includes a programmed processor for causing the voltage percentage and the current percentage to be processed, and programmed to add the voltage percentage and the current percentage to produce a sum.

10. The electrical strike sensing system of claim 9, wherein the processor is programmed to convert a number of indications of the sensed current and the sensed voltage to respective groups of digital signals, and programmed to process the respective groups of digital signals to identify a respective maximum current amplitude and a respective maximum voltage amplitude.

11. The electrical strike sensing system of claim 9, wherein the processor is programmed to compare the sum with the threshold value.

12. The electrical strike sensing system of claim 11, wherein the processor is programmed to use a digital current maximum to determine the current percentage and to use a digital voltage maximum to determine the voltage percentage.

13. A method of sensing a potentially hazardous condition to personnel when equipment contacts an electrical conductor, comprising the steps of:

sensing a current dram by the equipment as a result of the potentially hazardous condition to personnel and providing a current indication;

sensing a voltage between the equipment and a reference and providing a voltage indication;

combining the current and the voltage indications;

comparing the combined current and voltage indications with a predefined threshold; and providing an alarm if the combined current and voltage indications exceed said predefined threshold.

14. The method of claim 13, further including displaying on a visual display the current and voltage indications.

15. The method of claim 13, further including illuminating one or more indicators of a group of indicators in accordance with a magnitude of the combined voltage and current indications.

16. The method of claim 13, further including comparing a measured voltage with a reference in the range of about 35–50 volts, and comparing a measured current with a reference in the range of about 350–500 milliamps.

17. The method of claim 13, further including comparing a measured current with a reference current level to provide a percentage defining said current indication, and comparing a measured voltage with a reference voltage level to provide a percentage defining said voltage indication.

18. The method of claim 17, further including adding the current and voltage percentages and comparing a resultant summation with a 100% threshold.

19. The method of claim 13, further including storing in a nonvolatile memory parameters of the current and voltage indications.

20. The method of claim 19, further including storing in association with the current and voltage indications a date and time of occurrence of the current and voltage indications when said combined current and voltage indications exceed said threshold.

21. A method of sensing a potentially hazardous condition to personnel when equipment contacts an electrical conductor, comprising the steps of:

sensing a current and a voltage of the equipment as a result of the hazardous condition to personnel;

processing the sensed current and voltage to define a percentage parameter representative of a voltage percentage summed with a current percentage;

comparing the percentage parameter with a threshold percentage;

storing in a memory the percentages of the current and voltage when the threshold percentage is exceeded by the percentage parameter; and storing in the memory a time parameter in association with the current and voltage percentages as to when the threshold percentage was exceeded.

22. The method of claim 21, further including calculating said current percentage by dividing a measured current by a predefined current magnitude, and calculating said voltage percentage by dividing a measured voltage by a predefined voltage magnitude.

23. The method of claim 21, further including retrieving from the memory indications of the current and voltage percentages and displaying the same on a readout.

24. A method of sensing a potentially hazardous condition to personnel when equipment contacts an electrical conductor, comprising the steps of:

sensing a peak current drawn through the equipment as a result of said equipment contacting the electrical conductor;

sensing a peak voltage between the equipment and a reference point as a result of the equipment contacting the electrical conductor;

dividing a reference current magnitude into said sensed peak current to define a current percentage;

dividing a reference voltage magnitude into said sensed peak voltage to define a voltage percentage;

adding the current percentage and voltage percentage; and if the added current and voltage percentages exceed a predefined threshold, providing an alarm to warn the personnel of the potentially hazardous condition.

25. The method of claim 24, wherein said predefined threshold constitutes 100%.

26. The method of claim 24, further including selecting the reference current magnitude as a magnitude that is above a spurious signal level, and selecting the reference voltage magnitude as a magnitude that is likely to present a potential for bodily harm.

27. An electrical strike sensing system for sensing potentially hazardous conditions to personnel when equipment contacts an electrical power conductor, comprising:

a current sensing circuit for sensing current carried by the equipment resulting from said potentially hazardous condition;

a voltage sensing circuit for sensing a voltage between the equipment and a reference;

a predefined threshold value above which dangerous electrical conditions of the equipment are considered to exist;

a processor programmed to convert a number of indications of the sensed current and the sensed voltage to respective groups of digital signals, and programmed to process the respective groups of digital signals to identify a respective maximum current amplitude and a respective maximum voltage amplitude;

said processor being programmed to process the digital current maximum and the digital voltage maximum by addition of digital signals representative thereof and produce an output; and a comparator for comparing said output with the threshold value to provide an alarm condition if said output exceeds the threshold value.

28. The electrical strike system of claim 27, wherein said processor is programmed to process said digital current maximum and said digital voltage maximum by deriving respective current and voltage ratios using a predefined current reference and a predefined voltage reference, and adding said current ratio to said voltage ratio to produce said output.

29. The electrical strike system of claim 27, wherein said comparator comprises said processor programmed to carry out a comparing function.

* * * * *